United States Patent [19]

Yang et al.

[11] Patent Number: 4,812,676
[45] Date of Patent: Mar. 14, 1989

[54] CURRENT MODE LOGIC SWITCHING CIRCUIT HAVING A SCHMITT TRIGGER

[75] Inventors: Ji L. Yang, Pal Alto; Ronald J. Melanson, Sunnyvale, both of Calif.

[73] Assignee: Digital Equipment Corporation, Maynard, Mass.

[21] Appl. No.: 135,457

[22] Filed: Dec. 21, 1987

[51] Int. Cl.⁴ .................. H03K 3/354; H03K 3/295; H03K 5/08; H03K 5/153

[52] U.S. Cl. .................. 307/290; 307/455; 307/356; 307/448; 307/559; 307/563; 307/608

[58] Field of Search ............ 307/455, 289, 290, 356, 307/448, 247.1, 248, 571, 572, 584, 594, 601, 608, 559, 565, 551, 563

[56] References Cited

U.S. PATENT DOCUMENTS

| | | | |
|---|---|---|---|
| 3,596,114 | 7/1971 | Maupin et al. | 307/290 X |
| 3,622,799 | 11/1971 | Marley | 307/455 |
| 3,671,764 | 6/1972 | Davis | 307/290 X |
| 4,443,717 | 4/1984 | Hague | 307/565 X |
| 4,677,315 | 6/1987 | Blauschild et al. | 307/290 X |
| 4,728,821 | 3/1988 | Yang et al. | 307/455 X |

Primary Examiner—Stanley D. Miller
Assistant Examiner—David R. Bertelson
Attorney, Agent, or Firm—Finnegan, Henderson, Farabow, Garrett, & Dunner

[57] ABSTRACT

A current mode logic circuit which is implemented with metal-semiconductor field effect transistors (MESFETs) has a triggering circuit which produces hysteresis in the output of the circuit. That is, the output switches abruptly after the input has almost completed a corresponding transition from one logical output to another in a manner characteristic of triggering circuits such as Schmidt triggers. A triggering voltage is generated in response to one of two complementary outputs by triggering transistors configured as a current switch. The triggering voltage delays switching of a logic switching circuit which produces the two outputs which are a logical or boolean function of the input or inputs. The MESFETs are implemented in gallium arsenide technologies and output is equal to the inverted input.

7 Claims, 4 Drawing Sheets

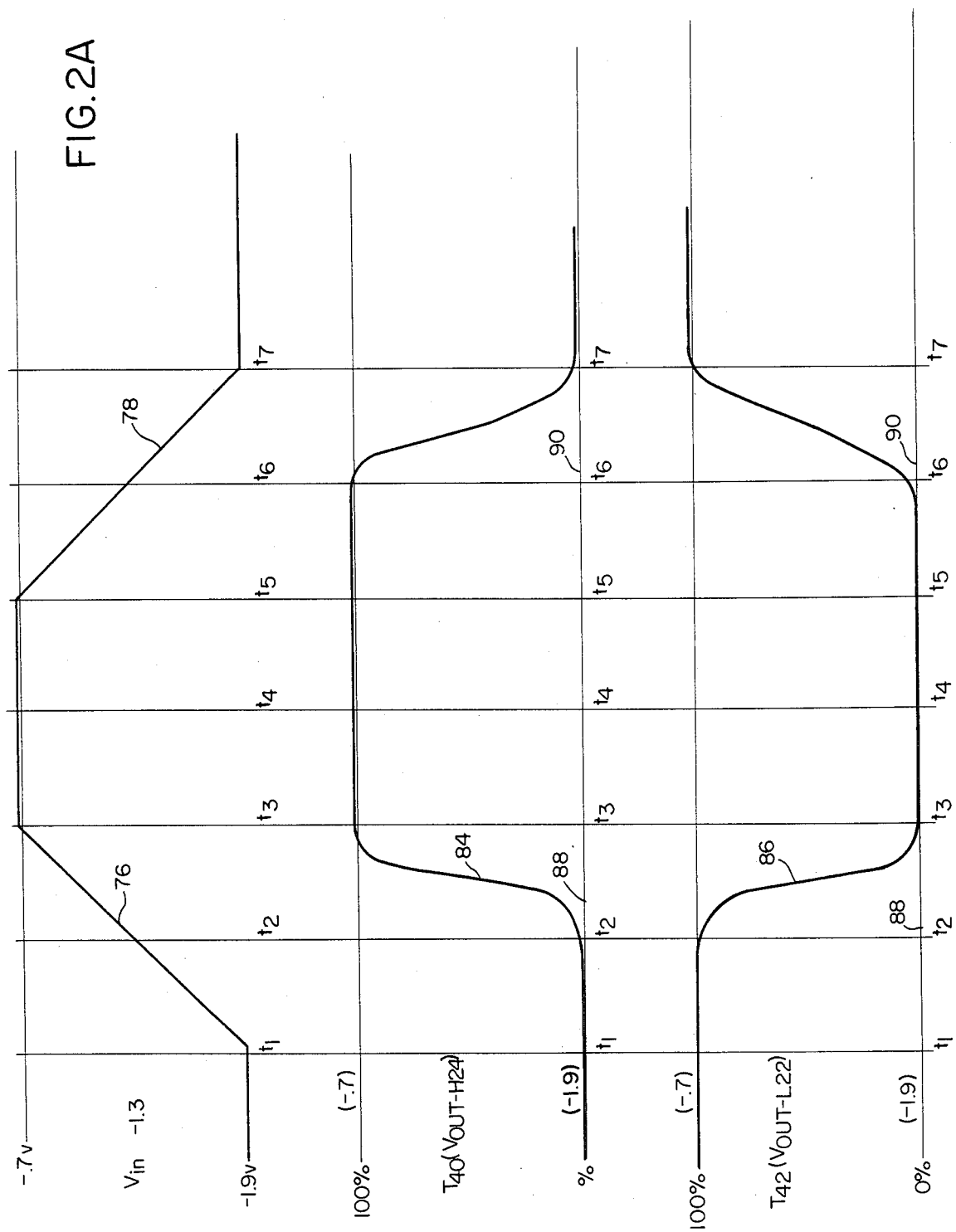

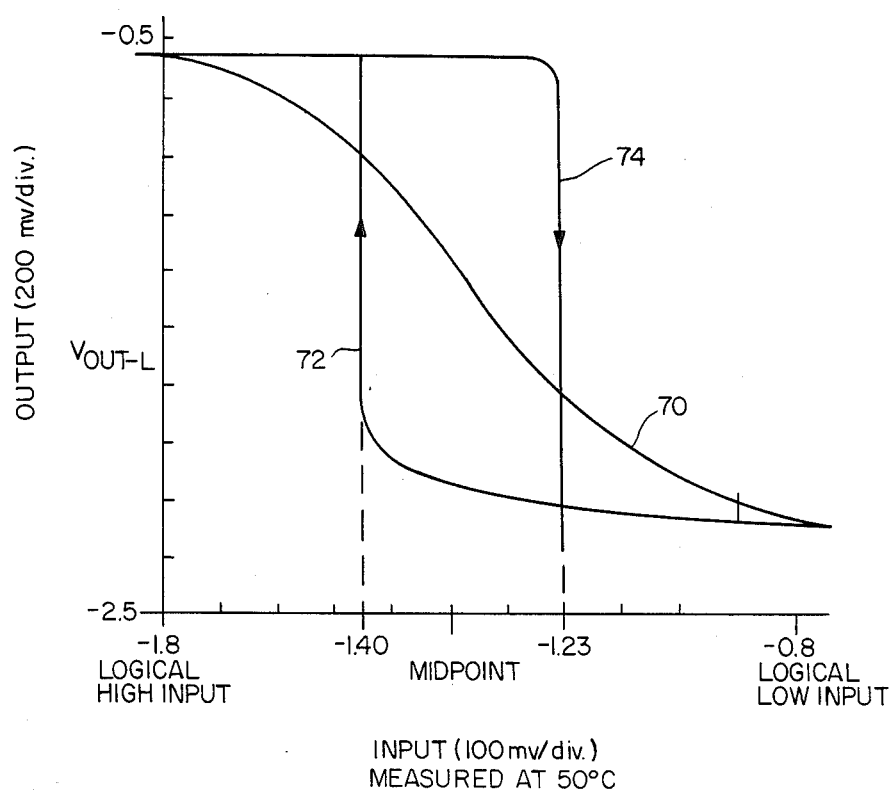

CURRENT MODE LOGIC SWITCHING CIRCUIT HAVING A SCHMITT TRIGGER

BACKGROUND OF THE INVENTION

The present invention relates to switching circuits, and more particularly to a high speed current mode logic circuit.

In logic circuits the input and output can take on one of two values and the output reflects a predetermined logical relationship between the input and output of the circuit. When the output of a circuit has a value between the two logical values which it is designed to generate, the output is indeterminate and is not useful to other logic circuits which receive this output. Logic circuits within a network of logic circuits which receive an indeterminate input signal must delay producing an output signal until the input has reached a final value. This delay propagates from one circuit to another and can seriously degrade the performance of the logic network.

Often times, within logical networks, signals are sent which are imperfect in a variety of ways. Some signals may have glitches which are brief changes in a signal value which do not reflect a change from one logical value to the next. A glitch in the input can cause a corresponding change in state of the logical circuit receiving this input. An output responsive to the glitch will be in error.

Prior to the present invention, when an input takes a relatively long time to switch from one logical value to another, the output logic will be indeterminate for this transition time period. Hysteresis, i.e., delaying the change in the output until the input nearly reaches its next logical value at the end of the transition time period, reduces the period of time that the output value will be indeterminate.

Circuits which introduce hysteresis, such as Schmidt triggers, have been designed for a variety of circuit types and device constructions which include implementations in emitter-coupled bipolar logic, NMOS and CMOS technologies. Many versions of the Schmitt trigger are constructed from two inverters connected in series with the output of the first inverter fed positively to the second inverter to achieve hysteresis in the DC transfer curve.

In bipolar emitter coupled logic, hysteresis is achieved by a trigger circuit that changes a reference voltage in accordance with the output of a resistor voltage divider. This implementation becomes impractical as the load current of modern emitter coupled logic is shrunk to a fraction of a milliampere. In order to minimize DC current in the resistor voltage divider to a small fraction of the load current, resistors used in the resistor voltage divider network of a trigger, circuit such as a Schmitt trigger must exceed megaohms. Implanted resistors have too small resistivity to be used and thin film resistors tend to complicate processing.

For logic circuits implemented in galium arsenide technologies, particularly metal semiconductor field effect transistors (MESFET), the resistor voltage divider approach is particularly impractical because at the present time high resistivity thin film resistors are not available for most GaAs processing.

Additionally, in GaAs MESFET circuits there is fairly strict maximum DC current loading requirements for the reference voltage power supply which makes resistive networks difficult to work with. In addition for saturated current mode GaAs MESFET circuits, as described in U.S. patent application Ser. No. 06/725,255, half of the DC current passes through clamping diodes and the other half passes through a load MESFET. There is an even greater need to minimize any loss of DC current due to a trigger circuit such as a Schmitt trigger in these types of circuits.

SUMMARY OF THE INVENTION

A principal object of the present invention is to provide a current mode logic circuit having hysteresis.

Another object of the invention is to provide a circuit which has an indeterminate output value for a minimum amount of time after corresponding input changes.

Still another object of the present invention is to provide a circuit which accepts slowly changing logical inputs and inaccurate logical inputs and produces a logical output having fast transitions and a stable value.

Additional objects and advantages of the invention will be set forth in part in the description which follows, and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the current mode logic circuit having an output which changes, between a peak logical high voltage and a peak logical low voltage of this invention comprises an input circuit means for receiving logical input voltages that shift between a peak high voltage and a peak low voltage, the shift occurring over a transition time period, output circuit means including first and second output terminals, responsive to a change in current flow, for effecting a transition at the respective first and second output terminals between the logical peak high voltage and the logical peak low voltage corresponding to the logical input voltage, switching circuit means operatively coupled to the output circuit means including first and second transistors operative to be switched between a respective conducting and non-conducting state in response to the shift in input voltage during the transition time period, the change in current flow corresponding to the input voltage, triggering means operatively connected to the first and second transistors responsive to the voltage at one of the first and second output terminals for delaying the switching of the transistors for a predetermined time during the transition time period and the change between the peak logical high and peak logical low output voltage occurs abruptly during a portion of the transition time period.

The accompanying drawings, which are incorporated in and constitute a part of the specification, illustrate one embodiment of the invention and, together with the description, serve to explain the principles of the invention.

BRIEF DESCRIPTION OF THE DRAWINGS

FIGS. 2A and 2B when placed one on top of the other is a timing diagram illustrating changes in voltage and current conduction of different parts of the circuit of the preferred embodiment; and FIG. 3 is a DC transfer curve showing the relationship between the voltage in and the voltage out.

DESCRIPTION OF THE PREFERRED EMBODIMENT

Reference will now be made in detail to the present preferred embodiment of the invention, an example of which is illustrated in the accompanying drawings.

Figure 1:
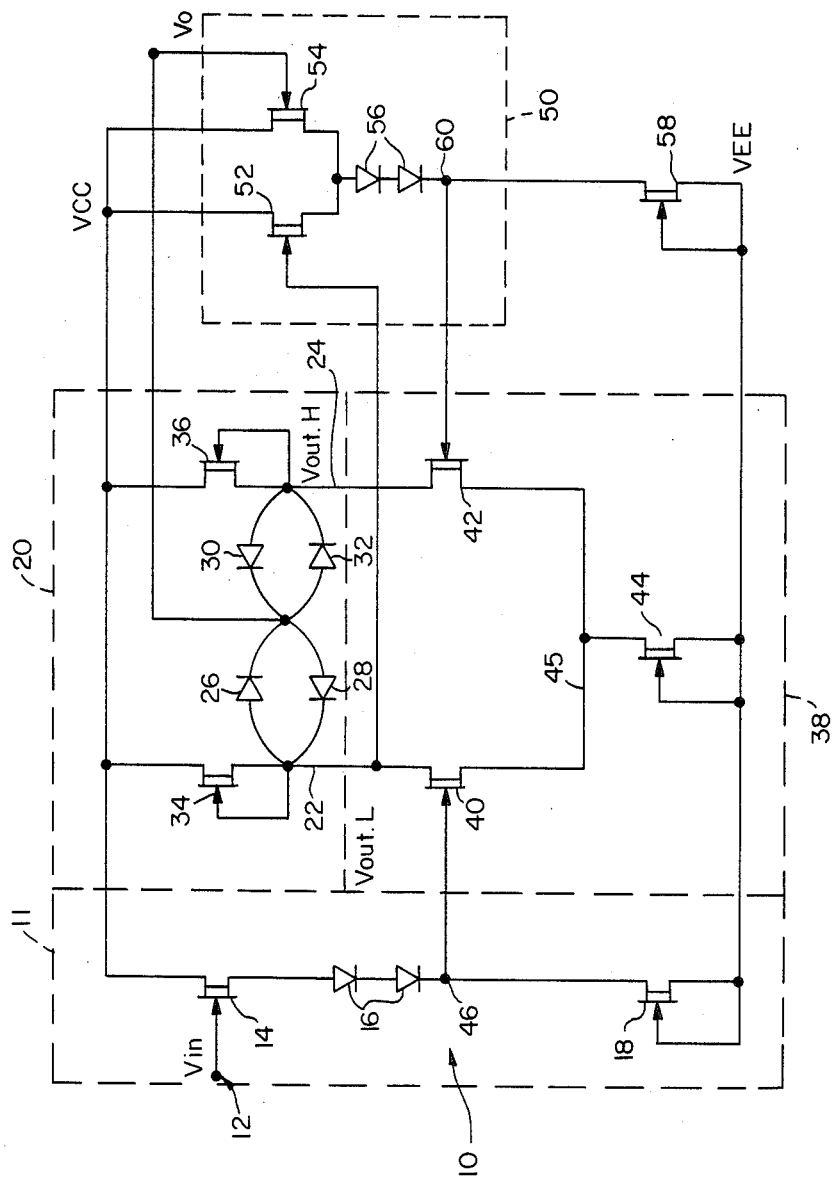
FIG. 1 is a circuit diagram of a preferred embodiment of the present invention.

The preferred embodiment of the current mode logic circuit is illustrated by way of example in FIG. 1 and is represented generally by numeral 10. The current mode logic circuit of the present invention has an output which transfers between a peak logical high voltage and a peak logical low voltage and includes an input circuit means for receiving logical input voltages that shift between a peak high voltage and a peak low voltage, said shift occurring over a transition time period. As embodied herein, input circuit means includes an input circuit 11 having a voltage input terminal 12, an input transistor 14, two diodes 16 and a current source transistor 18.

Voltage input terminal 12 is connected to the gate of input transistor 14, which like all the transistors described herein is a GaAs MESFET. Preferably and not intending to be limiting, the transistors used in the preferred embodiment are depletion mode MESFET's which conduct current from a drain power supply at the top of the circuit having a voltage $V_{cc}$ to a source power supply at the bottom of the circuit having a voltage $V_{ee}$.

Preferably, input circuit 11 is comprised of transistors 14 and 18 connected in a source follower arrangement having level shifting diodes 16 positioned in series between input transistor 14 and current source transistor 18. The input transistor 14 is the source follower of the source follower configuration of transistors 14 and 18. Transistor 14 is intended to operate in the saturation region. The drain of transistor 14 is coupled to power source $V_{cc}$ and the source terminal is connected in series with diodes 16 and the drain terminal of current source transistor 18. Diodes 16 are connected such that current will flow only in the direction from power source $V_{cc}$ to power source $V_{ee}$.

Input terminal 12 receives an input voltage $V_{in}$ which shifts between a peak high voltage designated as a logical high voltage and a peak low voltage designated as a logical low voltage. The shift occurs over a transition time period which, as will be described in detail below, is illustrated in curve $V_{in}$ of FIG. 2A.

The voltage at the source terminal of transistor 14 follows the voltage at input terminal 12. Input transistor 14 presents a high impedance input to logical circuits whose outputs act as the input voltage at input terminal 12. The gate terminal of transistor 14 will not allow a substantial amount of current to pass through the metal into the channel underlying the gate terminal because the voltage across the gate and source terminals of transistor 14 is below the turn on voltage of the junction between the gate terminal and channel.

Current which flows down through diodes 16 causes voltage drops across the two diodes which in the preferred embodiment is equal to approximately 0.7 volts per diode due to the turn on voltage of the diodes.

Accordingly, the current mode logic circuit also includes an output circuit means including first and second output terminals, responsive to a change in current flow, for affecting a transition between said peak logical high voltage and said peak logical low voltage corresponding to the logical input voltage at the respective first and second output terminals. As herein embodied the output circuit means includes output circuit 20 which is comprised of output terminals 22 and 24 and a voltage clamping circuit.

Preferably, the voltage clamping circuit is comprised of diodes 26, 28, 30 and 32 and transistors 34 and 36 which like transistor 18 provide a regulated current from power source $V_{cc}$. Transistors 34 and 36 are GaAs MESFETs configured to operate in the saturation mode for supplying a fixed quantity of current.

The transistors 34 and 36 are connected in parallel with the respective drain terminals connected to power supply $V_{cc}$. The source terminals of transistors 34 and 36 are connected to the gate terminals of transistors 34 and 36, respectively, and to output terminals 22 and 24, respectively. Between output terminals 22 and 24 the diodes 26, 28, 30, 32 define two current paths consisting of two pairs 26, 32 and 28, 30 of diodes hooked in series. One current path consisting of diodes 26 and 32 defines a path of current travelling from output terminal 22 to output terminal 24.

The other current path defined by diodes 28 and 30 defines a current path conducting current from output terminal 24 to output terminal 22. The node between each of the two diode pairs 26, 32 and 28, 30 is a common node which is held at a constant voltage $V_0$.

When current is allowed to flow down from $V_{cc}$ through transistor 34 the output terminal 22 will be held at a low logical voltage value by the network defined by diodes 26, 28, 30, 32. Voltage $V_0$ is regulated to be, preferably, the average of the logical low and logical high voltage values. A logical low value at output terminal 22 will be clamped at a value lower than $V_0$ by the amount of voltage drop across diode 28. When current is conducted through output terminal 22, current will flow from the node at $V_0$ through diode 28 if the voltage level at output terminal 22 is lower than $V_0$ by an amount equal to the turn-on voltage of diode 28. As current is conducted through diode 28 the voltage at output terminal 22 will increase until $V_0$ is no longer greater than the voltage at output terminal 22 by an amount equal to the turn-on voltage of diode 28.

When output terminal 22 has a logical high value no current is conducted through output terminal 22. If the voltage at output terminal 22 increases to a value greater than voltage $V_0$ by an amount equal to the turn-on voltage of diode 26 then current is conducted from output terminal 22 through diode 26. Current will continue to flow through diode 26 until the voltage at output terminal 22 decreases to the point where the difference between the voltage at output terminal 22 and voltage $V_0$ is less than the turn-on voltage of diode 26 at which time diode 26 will no longer conduct current. Thus the logical high value will be clamped at a voltage greater than $V_0$ by an amount equal to the voltage necessary to turn on diode 26.

The voltage is clamped at output terminal 24 with diodes 30, 32 in the manner described for output terminal 22 and diodes 26, 28. For example in the case where output terminal 24 has a logical high value, when the voltage difference between the voltage at output terminal 24 and voltage $V_0$ exceeds the turn-on voltage of diode 30, current is conducted through diode 30 until the difference is less than the turn-on voltage of diode 30.

In accordance with the invention, the current mode logic circuit has a switching circuit means operatively coupled to said output circuit means including first and second transistors operative to be switched between a respective conducting and non-conducting state in response to said shift in input voltage during said transition period, said change in current flow corresponding to said input voltage. As embodied herein, the switching circuit means is within dashed lines 38 and includes switching transistors 40 and 42 and current source transistor 44. Switching transistors 40 and 42 are connected in parallel having their respective drain terminals connected to output terminals 22 and 24. The source terminals of transistors 40 and 42 are connected to a common node 45. Current source transistor 44 is connected in series both parallel switching transistors 40 and 42. Current source transistor 44 is connected at common node 45 with transistors 40 or 42 in the current source follower mode so as to regulate the total amount of current which may flow from output terminals 22, 24 to common node 45. Node 45, which is connected to the drain terminal of transistor 44, is also connected to the source terminals of transistors 40 and 42. The source terminal and gate terminal of current source transistor 44 is also connected to power source $V_{ee}$.

Switching transistors 40 and 42, as a pair, constitute a current switch. The gate terminal of transistor 40 is connected to a voltage node 46 of input circuit 11 between series diodes 16 and current source transistor 18. This node 46 provides a voltage to switch the switch defined by switching transistors 40 and 42 in response to the voltage at input terminal 12.

Node 46, between diodes 16 and current source transistor 18, provides a shifted input voltage to transistor 40 in switching circuit 38. In operation, the voltage at node 46 follows the voltage at input terminal 12 proportionately. Since transistor 14 is operating in the saturation mode and coupled as a source follower the voltage input at input terminal 12 will appear at the source terminal of transistor 14. Diodes 16 shift the voltage down to a point usable by the switching circuit 38. Therefore, when the voltage at input terminal 12 is at a logical high value the voltage present at node 46 will achieve a shifted high value of voltage.

Current flow through output terminals 22 and 24 depends on which switching transistor 40 or 42 is turned-on. Switching transistors 40 and 42 are configured as a switch so that only one will be on at a time. Therefore, one of output terminals 22 and 24 will always have current passing through and one will not. As discussed previously with regard to the output circuit 20, if current is conducted through an output terminal 22 or 24 the voltage will be clamped at a low level and if no current flows through an output terminal 22 r 24 the voltage will be clamped at a high level. Thus, the voltage values at output terminals 22 and 24 are logical complements of each other.

Switching circuit 38 implements an inverter operation between input terminal voltage $V_{in}$ and output terminal voltage $V_{out-L}$. Switching circuit 38 and input circuit 11 may be configured with additional inputs in input circuit 11 and additional transistors in switching circuit 38 to implement other logical switching operations.

When the input voltage at input terminal 14 transfers from a logical low value to a logical high value the voltage at node 46 also approaches a shifted high value which will switch switching transistor 40 to a conducting state. When transistor 40 begins to conduct, transistor 42 will begin to switch off. Both transistors cannot remain on because current source transistor 44 limits the amount of current which may flow through switching transistors 40 and 42. As the voltage at node 46 increases and current begins to flow through transistor 40, the voltage at the source terminals of switching transistors 40 and 42 will increase. When the gate to source voltage of transistor 42 is less than the threshold voltage for transistor 42, then transistor 42 will shut off.

In accordance with the invention the current mode logic circuit includes a triggering circuit means operatively connected to said first and second transistors responsive to the voltage at one of said first and second output terminals for delaying said switching of said transistors for a predetermined time during the transition time period. As herein embodied, the triggering circuit means includes a triggering circuit within dashed lines 50 having triggering transistors 52 and 54 and level shifting diodes 56. Triggering circuit 50, which produces the hysteresis effect characteristic of a Schmidt trigger, has triggering transistors 52 and 54 connected in parallel with a common source and both of their drains connected to power source $V_{cc}$. The parallel arrangement of triggering transistors 52 and 54 is connected in series with level shifting diodes 56, and current source transistor 58 which is connected in the current source follower configuration with triggering transistors 54 or 52. A triggering voltage is provided at node 60 which is connected to the gate of switching transistor 42.

Triggering transistors 52 and 54 are connected to form a current switch. The gate of triggering transistor 54 is connected to the constant voltage $V_0$. The gate of triggering transistor 52 is connected to the output terminal 22.

Figure 2B:
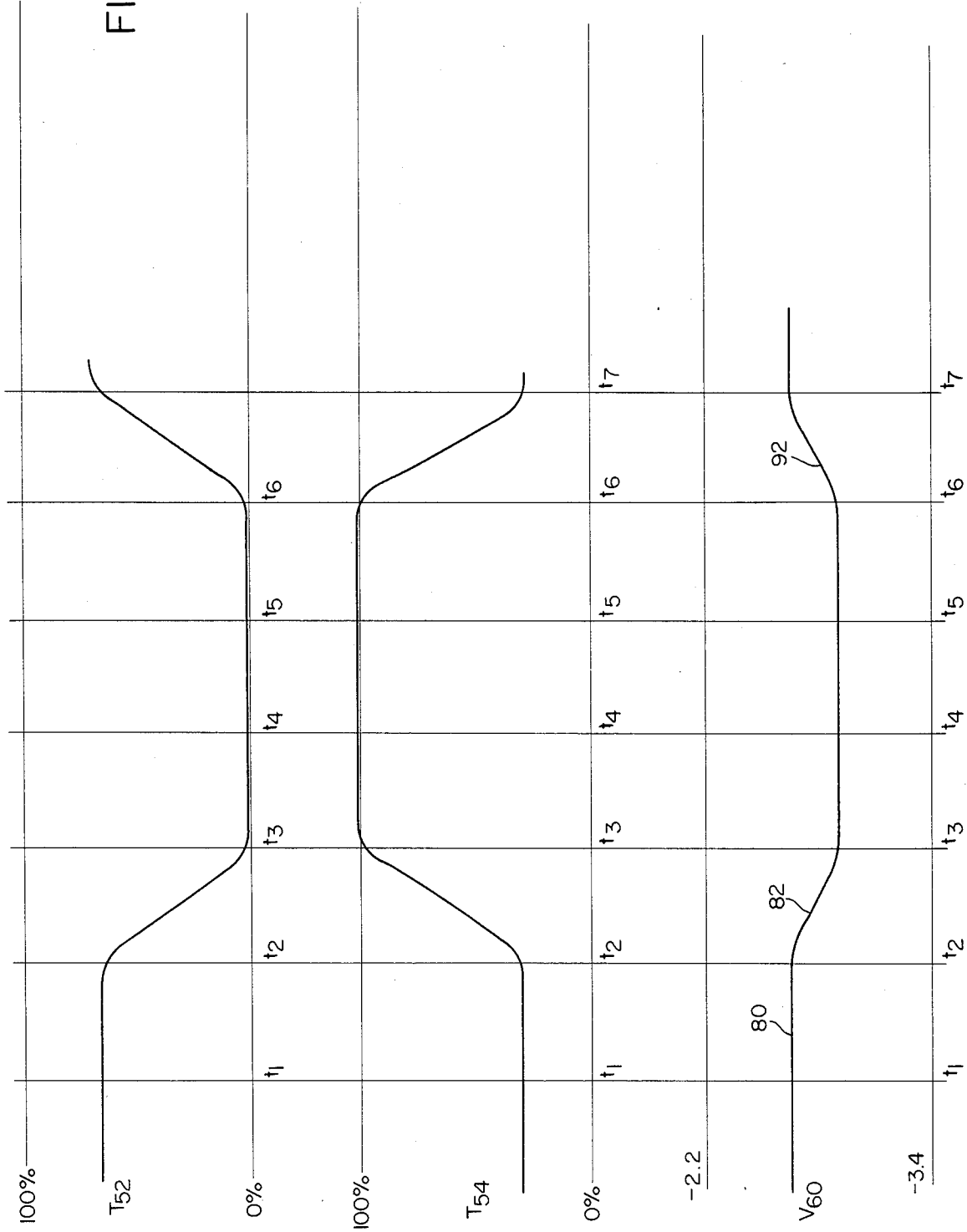

Operation of the circuit is illustrated in FIGS. 2A and 2B which show various operational graphs graphed against an arbitrary time scale designated $t_0$ through $t_8$. This arbitrary time scale can be considered to be equal to an input voltage axis. If the X-axis is considered to be the input voltage then $t_1$ would be equal to $-1.9$ v and $t_3$ would be equal to $-0.7$ v, $t_5$ would be equal to $-0.7$ v and $t_7$ would be equal to $-1.9$ v wherein the voltage scale would decrease from $t_5$ to $t_7$. Consideration of the operational characteristics illustrated as being graphed against input voltage better illustrates the hysteresis of the output voltage at output terminals 22 and 24 but for ease of description an arbitrary time scale was chosen. The voltage values chosen and relative proportions are not intended to be limiting.

As was discussed previously with reference to switching circuit 38, when the input voltage transfers between a logical low value to a logical high value the point at which both transistors 40 and 42 switch from respective conducting to non-conducting states is dependent on the point at which the voltage difference between the voltage at the gate terminal and the voltage at the source terminal of transistor 42 decreases below the threshold voltage value of transistor 42. Alternatively, if transistor 42 is not conducting and transistor 40 is conducting, as the gate voltage of transistor 40 decreases, transistor 42 will begin to conduct current when the source voltage drops to a point where the gate to source voltage difference of transistor 42 increases to the threshold value and transistor 42 begins to conduct current. The point at which the input voltage switches logical values, is illustrated in FIG. 3, which is a DC transfer curve for the voltage at output terminal 22. When the input voltage reaches $-1.40$ volts the output switches from high to low and when the input voltage reaches $-1.23$ volts the output voltage switches from low to high.

FIGS. 2A and 2B when placed one above the other contain graphical representation of the timing of six different characteristics of current mode logic circuit 10. Curve $V_{in}$ is a representation of an arbitrary linear input voltage. $T_{40}$ and $T_{42}$ are curves of the percent current conducted by transistors 40 and 42, respectively. Curves referred to as $V_{out-L}$ and $V_{out-H}$ are the voltage values at output terminals 22 and 24, respectively. These voltages follow the percent current conducted by transistors 42 and 40, respectively. In FIG. 2B, curves $T_{52}$ and $T_{54}$ are representations of the conductance of transistors 52 and 54, respectively, in triggering circuit 50. The curve $V_{60}$ represents the voltage at node 60.

At time $t_1$ the voltage at input terminal 12, shown in curve $V_{in}$, is at a logical low value. Consequently, the shifted voltage at node 46 is at a low value and transistor 40 is turned off and transistor 42 is turned on as shown in curves $T_{40}$ and $T_{42}$, respectively. Because transistor 40 is turned off and no current flows through output terminal 22, output terminal 22 is clamped at a high value. The logical high voltage value at the gate terminal of triggering transistor 52 causes an increased amount of current to flow through transistor 52. The transition time period for the input shifting from a peak logical low value to a peak logical high value is portion 76 on curve $V_{in}$ between $t_1$ and $t_3$. Portion 78 on curve $V_{in}$ between $t_5$ and $t_7$ illustrates the input voltage shift from a peak logical high value to a peak logical low value.

Transistors 52 and 54 are constructed with relative gate widths such that in the above described circuit condition at time $t_1$, the voltage at node 60, represented by curve $V_{60}$, is at a relatively high value as illustrated by portion 80 between lines $t_1$ and $t_2$. The gate widths are selected such that both transistors 52 and 54 are conducting current at the same time. Transistor 58 allows only a fixed amount of current to conduct through diodes 56. Therefore, if both transistors 52 and 54 are conducting, the voltage at the common sources of transistors 52 and 54 will increase so that the correct gate to source voltage is present at transistors 52 and 54 for the fixed amount of current conducted by these transistors.

Between $t_1$ and $t_2$ the input voltage, as shown on curve $V_{IN}$, is increasing and therefore the shifted voltage at node 46 is also increasing. The high voltage at node 60 as indicated by portion 80 of curve $V_{60}$ prevents transistors 40 and 42 from switching from nonconducting and conducting states, respectively. At approximately $t_2$ the voltage at node 46 will have increased to a point where transistor 40 has a large enough gate to source voltage to begin to conduct. Once transistor 40 begins to conduct, a very rapid switching occurs. In FIGS. 2A and 2B the switching time has been exaggerated for purposes of illustrating the operation of the invention. As transistor 40 begins to conduct current, current flow from power source $V_{cc}$ and causes the voltage to drop at output terminal 22. As the output voltage at output terminal 22 decreases so to will the voltage seen at the gate terminal of transistor 52 of the triggering circuit 50. The decrease in voltage at the gate terminal of transistor 52 divides the total current so that transistor 52 conducts less and transistor 54 conducts more of the total current. As transistor 54 conducts more current, the voltage at the source terminal of transistor 54 will decrease resulting in a proportionate decrease in the shifted voltage appearing at node 60. As illustrated by curve $V_{60}$ of FIGS. 2B the decrease in the voltage at node 60 occurs at portion 82 between $t_2$ and $t_3$.

This decrease in voltage at mode 60 shown on curve $V_{60}$ in turn decreases the gate to source voltage of transistor 42 causing it to shut off abruptly as shown by portion 84 and 86 on curves $T_{40}$ and $T_{42}$ corresponding to output voltage curves $V_{out-H}$ and $V_{out-L}$ respectively. Thus triggering circuit 50 has delayed the output switching for a predetermined time from $t_1$ to point 88 and from $t_5$ to point 90 on curves corresponding to $V_{out-H}$ and $V_{out-L}$. As seen at time $t_3$ when the transistors complete the switching cycle the voltage at output terminal 22 will be clamped to a low value and the voltage at output terminal 24 will be clamped at a high value. The logical low voltage at output terminal 22 will cause transistor 52 to be turned off so that all the current flowing through triggering circuit 50 flows through transistor 54 resulting in a low voltage at node 60. Node 60 is at a relatively low voltage because all the current can flow through transistor 54 without the need for a limiting bias voltage across the gate and source terminals.

If the input voltage is now decreased as shown starting at $t_5$ basically the opposite effect as described for the voltage going from a low to a high voltage value will occur. That is, transistor 40 will remain on from $t_5$ until $t_6$ as shown by curve $T_{40}$, because the gate to source voltage of transistor 42 is relatively low. At $t_6$ the gate to source voltage of transistor 40 will have decreased to a point where it will begin to turn off. As transistor 40 turns off the output voltage $V_{OUT-L}$, as shown on curve $T_{42}$, will begin to increase and consequently the voltage seen at the gate of transistor 52 will increase. An increase in the gate to source voltage at transistor 52 will cause transistor 52 to begin to switch on and transistor 54 to begin to switch off, as shown at $t_6$ on curves $T_{52}$ and $T_{54}$, respectively. In order to limit the amount of current flowing through the diodes to the voltage source $V_{ee}$, the voltage at the source terminals of transistors 52 and 54 will have to increase. This increased voltage will in turn cause the shifted voltage at node 60 to increase, as shown at portion 92 on curve $T_{60}$ between $t_6$ and $t_7$, and the resultant gate to source voltage at transistor 42 will increase at the same time the gate to source voltage at transistor 40 is decreasing. These opposite effects will cause transistor 42 to switch on rapidly and transistor 40 to switch off rapidly as shown on curves $T_{40}$ and $T_{42}$ between $t_6$ and $t_7$. Because the voltage at the output terminals follows the conductance proportionally of transistors 40 and 42 the output voltages will also switch rapidly.

Referring to FIG. 3, curve 70 represents the DC transfer curve for a circuit without the Schmidt triggering effect described above. It can be seen that the output voltage transfers gradually and in proportion to the input. Graph characteristic 74 represents the transition of the present invention for an input going from high to low. From this it can be seen that the output transfers very abruptly between a high to a low value close to the point at which the input achieves its high value. The converse is true for the graph 72 representing an input transition from high to low.

It will be apparent to those skilled in the art that various modifications and variations can be made and that current mode logic circuit of the present invention without departing from the scope or spirit of the invention. As an example, the switching circuit 38 can be altered to produce different boolean relationships between the output and an additional input in the input circuit 10. Thus, it is intended that the present invention cover the modifications and variations of this invention provided they come within the scope of the appended claims and their legally permissible equivalents.

What is claimed is:

1. A current mode logic circuit having an output which changes, between a peak logical high voltage and a peak logical low voltage, comprising:

an input circuit means for receiving logical input voltages that shift between a peak logical high voltage and a peak logical low voltage, said shift occurring over a transition time period;

output circuit means including first and second output terminals, responsive to a change in current flow, for effecting a transition between said peak logical high voltage and said peak logical low voltage at the respective first and second output terminals corresponding to the logical input voltage;

switching circuit means operatively coupled to said output circuit means including first and second transistors operative to be switched between a respective conducting and non-conducting state in response to said shift in input voltage during said transition time period, said change in current flow corresponding to said input voltage;

triggering circuit means operatively connected to said first and second transistors responsive to the voltage at one of said first and second output terminals for delaying said switching of said transistors for a predetermined time during the transition time period; and said transfer between the peak logical high and peak logical low output voltage occurs abruptly during a portion of the transition time period.

2. A current mode logic circuit according to claim 1, wherein said output circuit means further includes a voltage clamping circuit for clamping the logical output voltage at said respective first and second output terminals.

3. A current mode logic circuit according to claim 1, wherein said triggering circuit means includes means for supplying a reference voltage to said switching circuit means, said reference voltage changing between a low voltage and a high voltage, said reference voltage having a midpoint value at the end of said predetermined time during said transition time period.

4. A current mode logic circuit according to claim 3, wherein said triggering circuit means includes a third and fourth transistor, said third transistor connected to an output terminal for effecting the transition of said reference voltage between said low voltage and high voltage.

5. A current mode logic circuit according to claim 4, wherein said third and fourth transistors each have a gate terminal, a source terminal and a drain terminal, said gate terminal of said third transistor is connected to one of said first and second output terminals.

6. A current mode logic circuit according to claim 5, wherein both of the source terminals of said third and fourth transistors are connected to each other.

7. A current mode logic circuit according to claim 6, including means for applying a predetermined constant voltage to the gate terminal of the fourth transistor.

* * * * *

UNITED STATES PATENT AND TRADEMARK OFFICE
CERTIFICATE OF CORRECTION

PATENT NO. : 4,812,676

DATED : March 14, 1989

INVENTOR(S) : JI L. YANG ET AL.

It is certified that error appears in the above-identified patent and that said Letters Patent is hereby corrected as shown below:

In the Abstract, line 8: change "Schimidt" to --Schmitt--.

In the Drawings, sheet 2 of 4, FIG. 2A: the graph of $T_{40}$ insert --0-- in front of the percent (%) character.

Signed and Sealed this

Second Day of January, 1990

*Attest:*

JEFFREY M. SAMUELS

*Attesting Officer*    *Acting Commissioner of Patents and Trademarks*